United States Patent
Zhang et al.

(10) Patent No.: US 9,728,560 B2
(45) Date of Patent: Aug. 8, 2017

(54) TFT SUBSTRATE STRUCTURE

(71) Applicant: Shenzhen China Star Optoelectronics Technology Co., Ltd., Shenzhen, Guangdong (CN)

(72) Inventors: Hejing Zhang, Guangdong (CN); Chihyuan Tseng, Guangdong (CN); Chihyu Su, Guangdong (CN); Wenhui Li, Guangdong (CN); Longqiang Shi, Guangdong (CN); Xiaowen Lv, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/393,690

(22) Filed: Dec. 29, 2016

(65) Prior Publication Data

US 2017/0110483 A1    Apr. 20, 2017

Related U.S. Application Data

(62) Division of application No. 14/423,126, filed on Feb. 21, 2015.

(30) Foreign Application Priority Data

Dec. 23, 2014  (CN) .......................... 2014 1 0814177

(51) Int. Cl.
 *H01L 27/12* (2006.01)
 *H01L 27/32* (2006.01)
 *H01L 29/786* (2006.01)

(52) U.S. Cl.
 CPC ........ *H01L 27/1251* (2013.01); *H01L 27/124* (2013.01); *H01L 27/1222* (2013.01);
 (Continued)

(58) Field of Classification Search
 CPC ............ H01L 27/1225; H01L 27/1229; H01L 27/1251; H01L 27/3262; H01L 29/78663; H01L 29/78672; H01L 29/7869
 (Continued)

(56) References Cited

U.S. PATENT DOCUMENTS

2013/0214279 A1* 8/2013 Nishimura .......... G02F 1/13338
 257/59
2015/0053935 A1* 2/2015 Gupta ................. H01L 27/3262
 257/40

FOREIGN PATENT DOCUMENTS

JP   WO2011/135908   *  3/2011

* cited by examiner

*Primary Examiner* — Yasser A Abdelaziez
(74) *Attorney, Agent, or Firm* — Andrew C. Cheng

(57) ABSTRACT

The present invention provides a TFT substrate structure, comprising a Switching TFT and a Driving TFT, and the Switching TFT comprises a first active layer, and the Driving TFT comprises a second active layer, and the first active layer and the second active layer are made by the same or different materials and the electrical properties of the Switching TFT and the Driving TFT are different. According to the different functions of the different TFTs, the present invention employs different working structures for the Switching TFT and the Driving TFT to respectively implement deposition and photolithography, and employs different materials for the active layers of the Switching TFT and the Driving TFT to differentiate the electrical properties of different TFTs in the TFT substrate. Accordingly, the accurate control to the OLED with lowest cost can be realized.

2 Claims, 5 Drawing Sheets

(52) U.S. Cl.
CPC ...... *H01L 27/1225* (2013.01); *H01L 27/1229* (2013.01); *H01L 27/3262* (2013.01); *H01L 29/7869* (2013.01); *H01L 29/78663* (2013.01); *H01L 29/78672* (2013.01)

(58) Field of Classification Search
USPC .......................................................... 257/59
See application file for complete search history.

TFT SUBSTRATE STRUCTURE

CROSS REFERENCE TO RELATED APPLICATIONS

This is a divisional application of co-pending U.S. patent application Ser. No. 14/423,126, filed on Feb. 21, 2015, which is a national stage of PCT Application Number PCT/CN2015/072464, filed on Feb. 8, 2015, claiming foreign priority of Chinese Patent Application Number 201410814177.5, filed on Dec. 23, 2014. This application is also related to U.S. patent application Ser. No. 15/393,663, entitled TFT Substrate Structure; U.S. patent application Ser. No. 15/393,748, entitled TFT Substrate Structure; and U.S. patent application Ser. No. 15/394,424, entitled TFT Substrate Structure, submitted concurrently on the same day.

FIELD OF THE INVENTION

The present invention relates to a display technology field, and more particularly to a TFT substrate structure.

BACKGROUND OF THE INVENTION

Active Matrix/Organic Light Emitting Diode (AMOLED) is so called next generation display technology. The AMOLED possesses fast response speed, wide view angle, high contrast, et cetera in comparison with traditional TFT-LCD. The driving of OLED requires higher mobility for the backplate TFT. At present, the mobility of the developed amorphous silicon (a-Si) merely can reach up to 0.5~0.8 $cm^2/Vs$, which cannot satisfy the normal driving of OLED. The Low Temperature Poly-silicon (LTPS) and the metal oxide semiconductor (such as IGZO) with higher mobility can be the research point for the thin film transistor (TFT) of the active layer.

In AMOLED, the OLED is driven by the thin film transistor (TFT) in the backplate. The backplate TFTs can be categorized as the Switching TFT and the Driving TFT. The Switching TFT is only for realizing the switching function. Thus, TFTs of low price and stable process can be utilized. However, the Driving TFT demands enough mobility for realizing the driving of the OLED. The TFTs with larger mobility can be utilized therefor.

According to the traditional OLED backplate process at present, the same structure and process order are employed for the Switching TFT and the Driving TFT, which the active layer utilizes only one kind of material (metal oxide semiconductor or LTPS). It is difficult to achieve the differentiations of the two kinds of TFTs of different functions. On the other hand, the Switching TFT, the Driving TFT and the capacitor in one pixel are independent from one another, which is a disadvantage for increase of the aperture ratio.

A common 2T1C structure (two TFTs and one storage capacitor) of driving OLED is shown in FIG. 1: the two TFTs 101, 102 are both the etching stopper layer (ESL) structure. The active layers 201, 202 utilize one kind of material (the metal oxide semiconductor or the LTPS). Totally, five masks are required for accomplishing the passivation layer 600. Meanwhile, after the same manufacture process, the TFTs 101, 102 possess the same electrical properties.

SUMMARY OF THE INVENTION

An objective of the present invention is to provide a TFT substrate structure. According to the different functions of the different TFTs, the present invention employs different working structures for the Switching TFT and the Driving TFT to respectively implement deposition and photolithography, and employs different materials for the active layers of the Switching TFT and the Driving TFT to differentiate the electrical properties of different TFTs in the TFT substrate. Accordingly, the accurate control to the OLED with lowest cost can be realized.

For realizing the aforesaid objectives, the present invention provides a TFT substrate structure, comprising a Switching TFT and a Driving TFT, and the Switching TFT comprises a first active layer, and the Driving TFT comprises a second active layer, and the first active layer and the second active layer are made by the same or different materials and the electrical properties of the Switching TFT and the Driving TFT are different.

The TFT substrate comprises a substrate, a first active layer formed on the substrate, a first metal layer formed on the substrate and the first active layer, a first insulation layer formed on the first active layer and the first metal layer, and covering the substrate, a second active layer formed on the first insulation layer, a second metal layer formed on the first insulation layer, a third metal layer formed on the second active layer and the first insulation layer, a passivation layer formed on the second active layer and the third metal layer, and covering the first insulation layer, and a pixel electrode layer formed on the passivation layer, and contacting the third metal layer.

The TFT substrate comprises a substrate, a first metal layer formed on the substrate, a first insulation layer formed on the first metal layer, and covering the substrate and the first metal layer, a first active layer formed on the first insulation layer, a second metal layer formed on the first active layer and the first insulation layer, a second insulation layer formed on the second metal layer and the first active layer, and covering the first insulation layer, a second active layer formed on the second insulation layer, a third metal layer formed on the second active layer and the second insulation layer, a passivation layer formed on the second active layer and the third metal layer, and covering the second insulation layer, and a pixel electrode layer formed on the passivation layer and contacting the third metal layer.

The TFT substrate comprises a substrate, a first metal layer formed on the substrate, a first insulation layer formed on the first metal layer, a second metal layer formed on the first insulation layer, a first active layer formed on the second metal layer and contact the first insulation layer, a second insulation layer formed on the first active layer and the second metal layer, and covering the first insulation layer, a second active layer formed on the second insulation layer, a third metal layer formed on the second active layer and the second insulation layer, a passivation layer formed on the second active layer and the third metal layer, and covering the second insulation layer, and a pixel electrode layer formed on the passivation layer and contacting the third metal layer.

The TFT substrate comprises a substrate, a first metal layer formed on the substrate, a first insulation layer formed on the first metal layer, and covering the substrate and the first metal layer, a first active layer formed on the first insulation layer, an etching stopper layer formed on the first active layer, a second metal layer formed on the first insulation layer and the etching stopper layer, and covering the first active layer, a second insulation layer formed on the second metal layer, and covering the first insulation layer, a second active layer formed on the second insulation layer, a third metal layer formed on the second insulation layer, and covering two ends of the second active layer, a passivation layer formed on the third metal layer and the second active layer, and covering the second insulation layer, and a pixel electrode layer formed on the passivation layer and contacting the third metal layer.

Material of the first active layer and material of the second active layer respectively are amorphous silicon and metal oxide semiconductor, Low Temperature Poly-silicon and amorphous silicon, Low Temperature Poly-silicon and metal oxide semiconductor, or both metal oxide semiconductor.

The TFT substrate comprises a substrate, a first metal layer formed on the substrate, a first insulation layer formed on the first metal layer, and covering the substrate and the first metal layer, a first active layer formed on the first insulation layer, a second metal layer formed on two ends of the first active layer and the first insulation layer, a second insulation layer formed on the first active layer and the second metal layer, and covering the first insulation layer, a third metal layer formed on the second insulation layer, a second active layer formed on the third metal layer and contacting the second insulation layer, a passivation layer formed on the third metal layer and the second active layer, and covering the second insulation layer, and a pixel electrode layer formed on the passivation layer and contacting the third metal layer; the first active layer and the second active layer are at the same side of the substrate.

Material of the first active layer and material of the second active layer respectively are amorphous silicon and metal oxide semiconductor or both metal oxide semiconductor.

The present invention further provides a TFT substrate structure, comprising a Switching TFT and a Driving TFT, and the Switching TFT comprises a first active layer, and the Driving TFT comprises a second active layer, and the first active layer and the second active layer are made by the same or different materials and the electrical properties of the Switching TFT and the Driving TFT are different;

wherein the TFT substrate comprises a substrate, a first active layer formed on the substrate, a first metal layer formed on the substrate and the first active layer, a first insulation layer formed on the first active layer and the first metal layer, and covering the substrate, a second active layer formed on the first insulation layer, a second metal layer formed on the first insulation layer, a third metal layer formed on the second active layer and the first insulation layer, a passivation layer formed on the second active layer and the third metal layer, and covering the first insulation layer, and a pixel electrode layer formed on the passivation layer, and contacting the third metal layer;

wherein material of the first active layer and material of the second active layer respectively are amorphous silicon and metal oxide semiconductor, Low Temperature Poly-silicon and amorphous silicon, Low Temperature Poly-silicon and metal oxide semiconductor, or both metal oxide semiconductor.

The benefits of the present invention are: the present invention provides a TFT substrate structure. According to the different functions of the different TFTs, the present invention employs different working structures for the Switching TFT and the Driving TFT to respectively implement deposition and photolithography, and employs different materials for the active layers of the Switching TFT and the Driving TFT to differentiate the electrical properties of different TFTs in the TFT substrate. Accordingly, the accurate control to the OLED with lowest cost can be realized. The process is simple. The manufacture cost is low. By stacking-up deposing the TFTs with different functions, the aperture ratio is increased.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

The present invention provides a TFT substrate structure, comprising a Switching TFT and a Driving TFT, and the Switching TFT comprises a first active layer, and the Driving TFT comprises a second active layer, and the first active layer and the second active layer are made by the same or different materials and the electrical properties of the Switching TFT and the Driving TFT are different.

Figure 1:
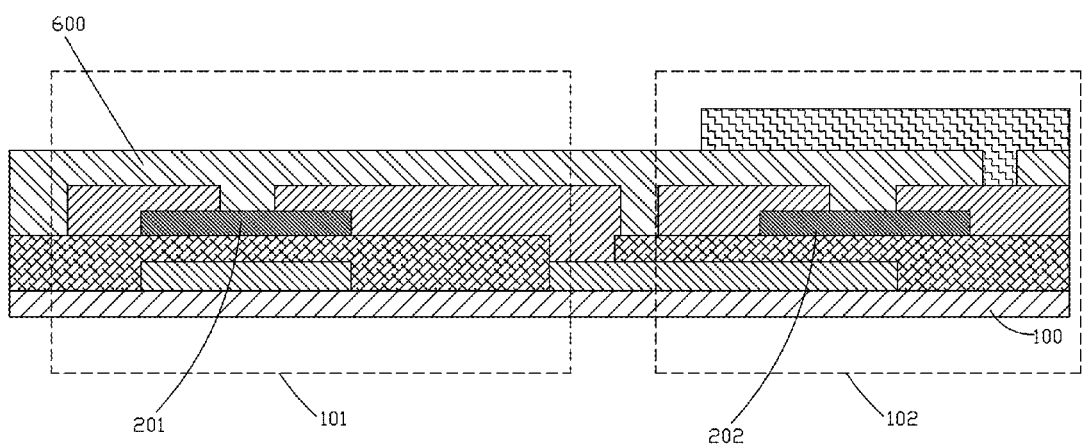
FIG. 1 is a structural diagram of a TFT substrate according to prior art.
Figure 2:
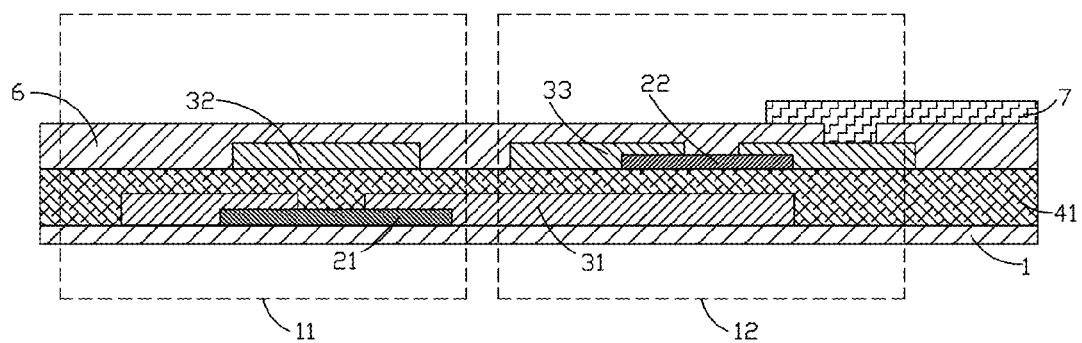
FIG. 2 is a structural diagram of a TFT substrate structure according to the first embodiment of the present invention.

Please refer to FIG. 2. The TFT substrate structure according to the first embodiment of the present invention is a combination formation of a top gate structure and a back channel etching (BCE) structure. Specifically, the TFT substrate structure comprises a substrate 1, a first active layer 21 formed on the substrate 1, a first metal layer 31 formed on the substrate 1 and the first active layer 21, a first insulation layer 41 formed on the first active layer 21 and the first metal layer 31, and covering the substrate 1, a second active layer 22 formed on the first insulation layer 41, a second metal layer 32 formed on the first insulation layer 41, a third metal layer 33 formed on the second active layer 22 and the first insulation layer 41, a passivation layer 6 formed on the second active layer 22 and the third metal layer 33, and covering the first insulation layer 41, and a pixel electrode layer 7 formed on the passivation layer 6, and contacting the third metal layer 33.

Specifically, in this structure, the left side of the first metal layer 31 is a source/a drain of a TFT 11, the right side is a gate of a TFT 12, i.e. the gate of the TFT 12 and the drain of the TFT 11 are connected. The second metal layer 32 is a gate of the TFT 11, and the third metal layer 33 is a source/a drain of the TFT 12.

Figure 3:
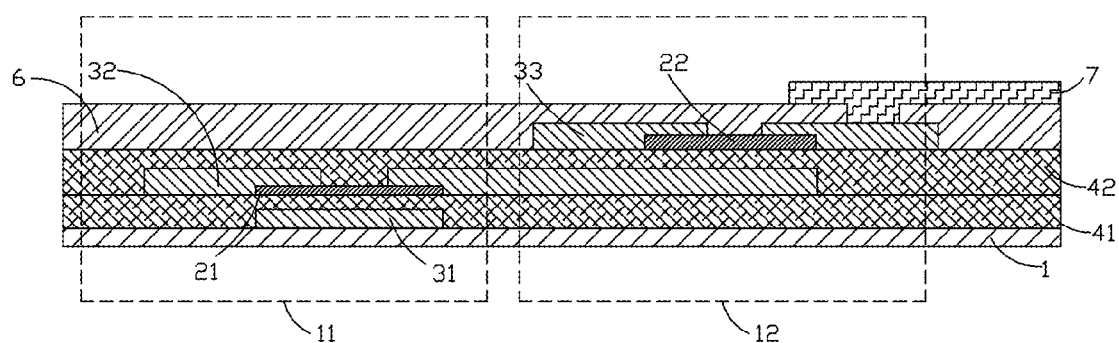
FIG. 3 is a structural diagram of a TFT substrate structure according to the second embodiment of the present invention.

Please refer to FIG. 3. The TFT substrate structure according to the second embodiment of the present invention is a combination formation of two back channel etching (BCE) structures. Specifically, the TFT substrate structure comprises a substrate 1, a first metal layer 31 formed on the substrate 1, a first insulation layer 41 formed on the first metal layer 31, and covering the substrate 1 and the first metal layer 31, a first active layer 21 formed on the first insulation layer 41, a second metal layer 32 formed on the first active layer 31 and the first insulation layer 41, a second insulation layer 42 formed on the second metal layer 32 and the first active layer 21, and covering the first insulation layer 41, a second active layer 22 formed on the second insulation layer 42, a third metal layer 33 formed on the second active layer 22 and the second insulation layer 42, a passivation layer 6 formed on the second active layer 22 and the third metal layer 33, and covering the second insulation layer 42, and a pixel electrode layer 7 formed on the passivation layer 6 and contacting the third metal layer 33.

Specifically, in this structure, the first metal layer 31 is a gate of a TFT 11, the left side of the second metal layer 32 is a source/a drain of a TFT 11, and the right side is a gate of the TFT 12, i.e. the gate of the TFT 12 and the drain of the TFT 11 are connected. The third metal layer 33 is a source/a drain of the TFT 12.

Figure 4:
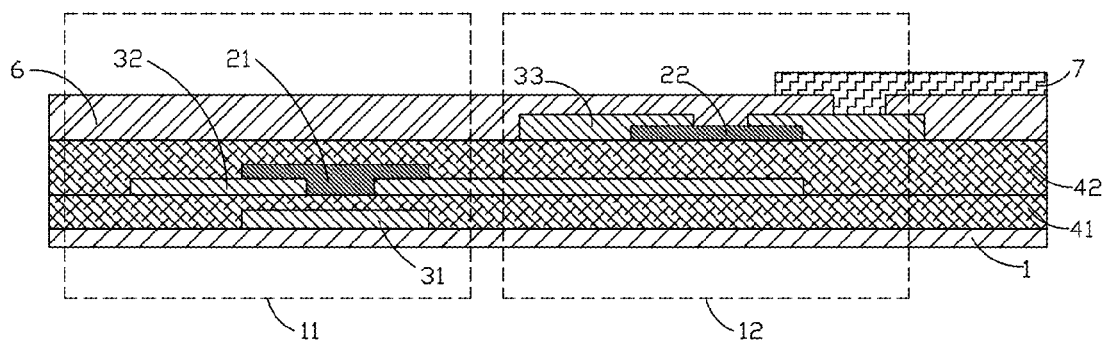
FIG. 4 is a structural diagram of a TFT substrate structure according to the third embodiment of the present invention.

Please refer to FIG. 4. The TFT substrate structure according to the third embodiment of the present invention is a combination formation of a Co-planar structure and a back channel etching (BCE) structure. Specifically, the TFT substrate structure comprises a substrate 1, a first metal layer 31 formed on the substrate 1, a first insulation layer 41 formed on the first metal layer 31, a second metal layer 32 formed on the first insulation layer 41, a first active layer 21 formed on the second metal layer 32 and contact the first insulation layer 41, a second insulation layer 42 formed on the first active layer 21 and the second metal layer 32, and covering the first insulation layer 41, a second active layer 22 formed on the second insulation layer 42, a third metal layer 33 formed on the second active layer 22 and the second insulation layer 42, a passivation layer 6 formed on the second active layer 22 and the third metal layer 33, and covering the second insulation layer 42, and a pixel electrode layer 7 formed on the passivation layer 6 and contacting the third metal layer 33.

Specifically, in this structure, the first metal layer 31 is a gate of a TFT 11, the left side of the second metal layer 32 is a source/a drain of a TFT 11, and the right side is a gate of the TFT 12, i.e. the gate of the TFT 12 and the drain of the TFT 11 are connected. The third metal layer 33 is a source/a drain of the TFT 12.

Significantly, in the TFT substrate shown in FIG. 4, the first TFT 11 employs a formation of the Co-planar structure (Co-planar), and the second TFT 12 employs a formation of the back channel etching (BCE). Similarly, the first TFT 11 can employ a formation of the back channel etching (BCE), while the second TFT 12 employs a formation of the Co-planar structure (Co-planar).

Figure 5:
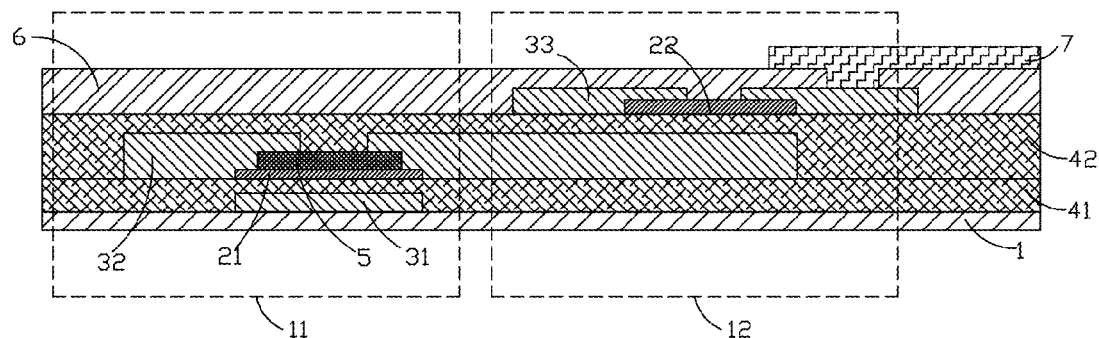
FIG. 5 is a structural diagram of a TFT substrate structure according to the fourth embodiment of the present invention.

Please refer to FIG. 5. The TFT substrate structure according to the fourth embodiment of the present invention is a combination formation of an etching stopper layer (ESL) and a back channel etching (BCE) structure. Specifically, the TFT substrate structure comprises a substrate 1, a first metal layer 31 formed on the substrate, a first insulation layer 41 formed on the first metal layer 31, and covering the substrate 1 and the first metal layer 41, a first active layer 21 formed on the first insulation layer 41, an etching stopper layer 5 formed on the first active layer 21, a second metal layer 32 formed on the first insulation layer 41 and the etching stopper layer 5, and covering the first active layer 21, a second insulation layer 42 formed on the second metal layer 32, and covering the first insulation layer 41, a second active layer 22 formed on the second insulation layer 42, a third metal layer 33 formed on the second insulation layer 42, and covering two ends of the second active layer 22, a passivation layer 6 formed on the third metal layer 33 and the second active layer 22, and covering the second insulation layer 42, and a pixel electrode layer 7 formed on the passivation layer 6 and contacting the third metal layer 33.

Specifically, in this structure, the first metal layer 31 is a gate of a TFT 11, the left side of the second metal layer 32 is a source/a drain of a TFT 11, and the right side is a gate of the TFT 12, i.e. the gate of the TFT 12 and the drain of the TFT 11 are connected. The third metal layer 33 is a source/a drain of the TFT 12.

Significantly, in the TFT substrate shown in FIG. 5, the first TFT 11 employs a formation of the etching stopper layer (ESL), and the second TFT 12 employs a formation of the back channel etching (BCE). Similarly, the first TFT 11 can employ a formation of the back channel etching (BCE), while the second TFT 12 employs a formation of the etching stopper layer (ESL).

Furthermore, in the aforesaid first to fourth embodiments of the TFT substrate, material of the first active layer 21 and material of the second active layer 22 respectively are amorphous silicon (a-Si) and metal oxide semiconductor, Low Temperature Poly-silicon (LTPS) and amorphous silicon (a-Si), or both metal oxide semiconductor. Besides, in the aforesaid first embodiment, the material of the second active layer 22 respectively can be Low Temperature Poly-silicon (LTPS) and metal oxide semiconductor.

Preferably, material of the oxide semiconductor can be Indium Gallium Zinc Oxide (IGZO).

Figure 6:
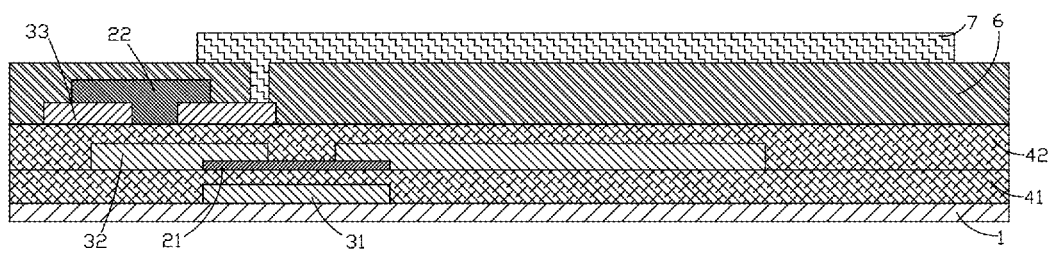
FIG. 6 is a structural diagram of a TFT substrate structure according to the fifth embodiment of the present invention.

Please refer to FIG. 6. The TFT substrate structure according to the fifth embodiment of the present invention is a combination formation of a Co-planar structure and a back channel etching (BCE) structure. Specifically, the TFT substrate structure comprises a substrate 1, a first metal layer 31 formed on the substrate 1, a first insulation layer 41 formed on the first metal layer 31, and covering the substrate 1 and the first metal layer 31, a first active layer 21 formed on the first insulation layer 41, a second metal layer 32 formed on two ends of the first active layer 21 and the first insulation layer 41, a second insulation layer 42 formed on the first active layer 21 and the second metal layer 32, and covering the first insulation layer 41, a third metal layer 33 formed on the second insulation layer 42, a second active layer 22 formed on the third metal layer 33 and contacting the second insulation layer 42, a passivation layer 6 formed on the third metal layer 33 and the second active layer 22, and covering the second insulation layer 42, and a pixel electrode layer 7 formed on the passivation layer 6 and contacting the third metal layer 33; the first active layer 21 and the second active layer 22 are at the same side of the substrate 1. By stacking-up deposing the TFTs with different functions, the occupied area of TFTs is diminished and the aperture ratio is increased.

Furthermore, material of the first active layer 21 and material of the second active layer 22 respectively are amorphous silicon (a-Si) and metal oxide semiconductor, or both metal oxide semiconductor. Preferably, material of the oxide semiconductor can be Indium Gallium Zinc Oxide (IGZO).

Figure 7:
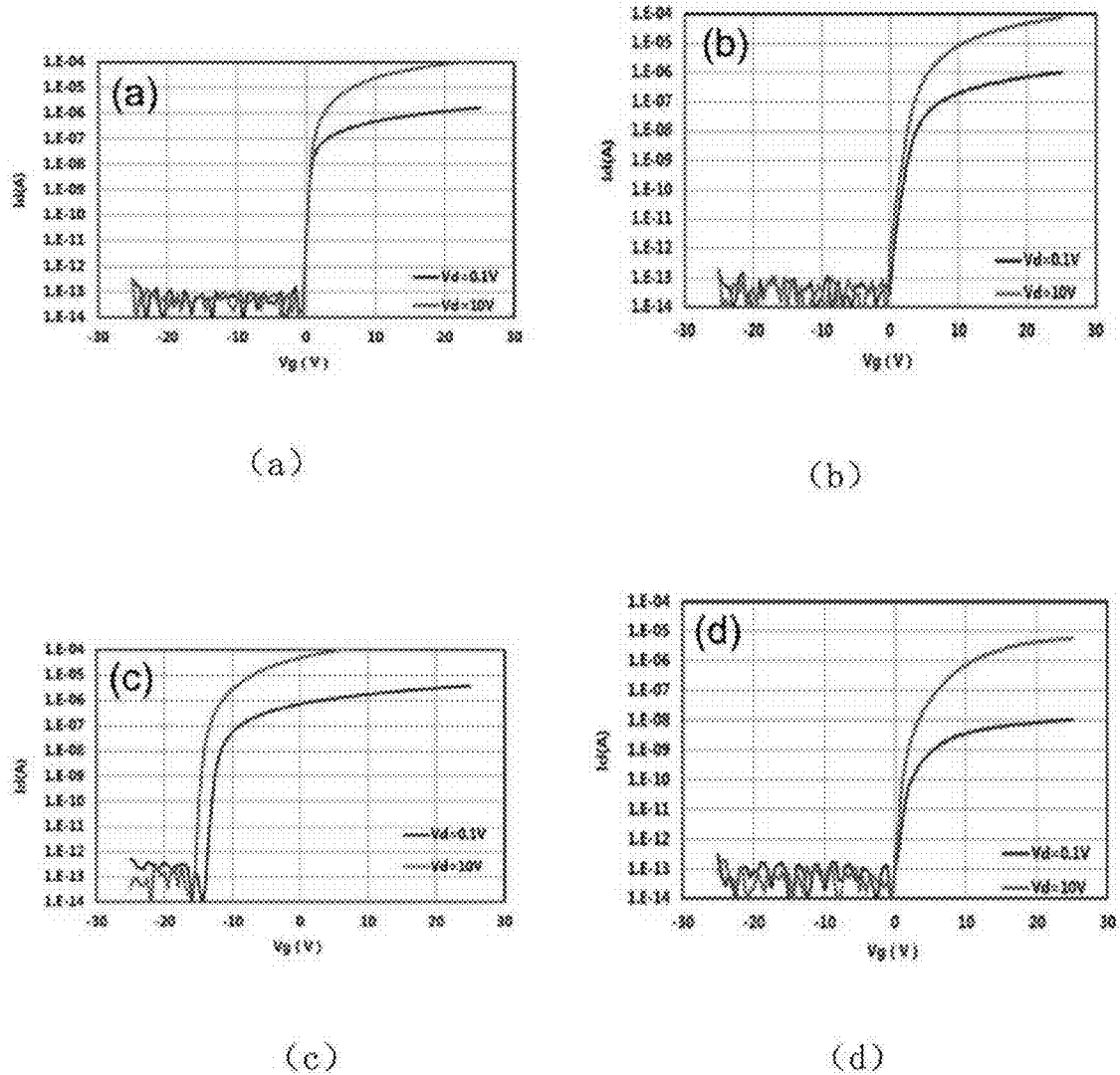
FIG. 7 shows electric property curve diagrams of the metal oxide semiconductor TFTs of the TFT substrate structure according to the present invention.

FIG. 7 shows electric property curve diagrams of the metal oxide semiconductor TFTs of the TFT substrate structure according to the present invention. It verifies that differentiations do exist between the Switching TFT and the Driving TFT in the TFT substrate of the present invention.

In the experiment and verification, both the active layers of the Switching TFT and the Driving TFT employ oxide semiconductor material. By changing the condition parameters of the experiments, the differentiations of the electrical properties of the two are achieved ultimately. Specifically, as shown in FIG. 7, (a) and (b) can realize the differentiation of S.S; (a) and (c) can realize the differentiation of Vth (similar to Vg to realize one TFT on and on TFT off) and also can be applied in other circuits; (a) and (d) can realize the differentiation of Ion. Therefore, the TFT substrate structure of the present invention can differentiate the electrical properties of different TFTs.

In conclusion, the present invention provides a TFT substrate structure. According to the different functions of the different TFTs, the present invention employs different working structures for the Switching TFT and the Driving TFT to respectively implement deposition and photolithography, and employs different materials for the active layers of the Switching TFT and the Driving TFT to differentiate the electrical properties of different TFTs in the TFT substrate. Accordingly, the accurate control to the OLED with lowest cost can be realized. The process is simple. The manufacture cost is low. By stacking-up deposing the TFTs with different functions, the aperture ratio is increased.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A thin-film transistor (TFT) substrate structure, comprising a Switching TFT and a Driving TFT, wherein the Switching TFT comprises a first active layer, and the Driving TFT comprises a second active layer, and the first active layer and the second active layer are made of the same or different materials and the electrical properties of the Switching TFT and the Driving TFT are different;

wherein the TFT substrate comprises a substrate, a first metal layer formed on the substrate, a first insulation layer formed on the first metal layer, a second metal layer formed on the first insulation layer, a first active layer formed on the second metal layer and contacting the first insulation layer, a second insulation layer formed on the first active layer and the second metal layer and covering the first insulation layer, a second active layer formed on the second insulation layer, a third metal layer formed on the second active layer and the second insulation layer, a passivation layer formed on the second active layer and the third metal layer and covering the second insulation layer, and a pixel electrode layer formed on the passivation layer and contacting the third metal layer.

2. The TFT substrate structure according to claim 1, wherein a material of the first active layer and a material of the second active layer are respectively amorphous silicon and metal oxide semiconductor, Low Temperature Polysilicon and amorphous silicon, Low Temperature Polysilicon and metal oxide semiconductor, or both being metal oxide semiconductor.

* * * * *